(12) United States Patent
West et al.

(10) Patent No.: US 9,790,589 B2
(45) Date of Patent: Oct. 17, 2017

(54) GAS COOLED SUBSTRATE SUPPORT FOR STABILIZED HIGH TEMPERATURE DEPOSITION

(71) Applicant: Applied Materials, Inc., Santa Clara, CA (US)

(72) Inventors: Brian West, San Jose, CA (US); Michael S. Cox, Gilroy, CA (US); Jeonghoon Oh, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 181 days.

(21) Appl. No.: 14/607,359

(22) Filed: Jan. 28, 2015

(65) Prior Publication Data

US 2015/0232983 A1 Aug. 20, 2015

Related U.S. Application Data

(60) Provisional application No. 61/943,595, filed on Feb. 24, 2014, provisional application No. 61/940,215, filed on Feb. 14, 2014.

(51) Int. Cl.
| | |
|---|---|
| *F28D 15/00* | (2006.01) |
| *C23C 14/54* | (2006.01) |
| *C23C 14/50* | (2006.01) |
| *H01L 23/34* | (2006.01) |
| *H01J 37/32* | (2006.01) |
| *H01L 21/67* | (2006.01) |

(52) U.S. Cl.
CPC ............ *C23C 14/541* (2013.01); *C23C 14/50* (2013.01); *H01J 37/3244* (2013.01); *H01J 37/32715* (2013.01); *H01J 37/32724* (2013.01); *H01L 21/67109* (2013.01); *H01L 23/34* (2013.01)

(58) Field of Classification Search
CPC .. H01J 37/3244; H01J 37/32724; H01L 23/34
See application file for complete search history.

(56) References Cited

U.S. PATENT DOCUMENTS

| | | | | |
|---|---|---|---|---|
| 4,190,016 | A * | 2/1980 | Hendricks | G21B 1/19 118/724 |
| 2005/0028736 | A1 | 2/2005 | Long | |
| 2007/0029642 | A1 | 2/2007 | Inagawa et al. | |
| 2007/0077770 | A1* | 4/2007 | Wang | B82Y 10/00 438/737 |
| 2007/0235134 | A1* | 10/2007 | Iimuro | H01L 21/67248 156/345.27 |
| 2008/0093057 | A1 | 4/2008 | Choi et al. | |
| 2010/0243437 | A1* | 9/2010 | Gessert | C23C 14/56 204/298.09 |
| 2011/0085299 | A1 | 4/2011 | Mizunaga et al. | |

OTHER PUBLICATIONS

PCT Notification of Transmittal of the International Search Report and the Written Opinion of the International Searching Authority for International Appication No. PCT/US2015/011203 dated Apr. 29, 2015; 14 total pages.

* cited by examiner

*Primary Examiner* — Jason M Berman
(74) *Attorney, Agent, or Firm* — Patterson + Sheridan LLP

(57) ABSTRACT

Embodiments of the present disclosure provides apparatus and method for stabilizing substrate temperature by flowing a flow of cooling gas to an inlet of cooling channels in a substrate support, receiving the flow of cooling gas from an outlet of the cooling channel using a heat exchanger, and releasing the cooling gas to an immediate environment, such as a cleanroom or a minienvironment.

20 Claims, 3 Drawing Sheets

GAS COOLED SUBSTRATE SUPPORT FOR STABILIZED HIGH TEMPERATURE DEPOSITION

CROSS-REFERENCE TO RELATED APPLICATIONS

This application claims priority to U.S. Provisional Patent Application Ser. No. 61/940,215, filed on Feb. 14, 2014, and U.S. Provisional Patent Application Ser. No. 61/943,595, filed on Feb. 24, 2014. Each of the aforementioned patent applications is herein incorporated by reference.

BACKGROUND

Field

Embodiments of the present disclosure relate to apparatus and methods for processing semiconductor substrates. More particularly, embodiments of the present disclosure relate to apparatus and methods for stabilizing substrate temperature during high temperature processing.

Description of the Related Art

In some semiconductor processes, temperature of the substrate being processed is usually maintained by a heat sink, such as a large thermal conductive body, attached to the substrate support. Traditionally, heat sinks used in high temperature physical vapor deposition (PVD) are not actively cooled because temperatures in these PVD chambers are so high that traditional coolants would boil in the heat sink cooling channel. Since traditional PVD recipes usually include fairly short deposition time, e.g. in the order of 10 s of seconds, heat load on the substrate can be dissipated by the relatively large heat sink below the substrates. However, as the time of deposition extends in PVD recipes, for example into the range of hundreds of seconds to thousands of seconds, non-actively cooled substrate support cannot dissipate the heat load on the substrate being processed resulting in process drift and degradation of the film being deposited. GALDEN® heat transfer fluid or other similar high boiling point coolants have been used in cooling the substrate support for long lasting PVD processes. However, these high boiling point coolants are not only expensive but also prone to thermal decomposition and may become corrosive and/or release harmful gases, such as HF and fluorophosgene.

Therefore, there is a need for an improved apparatus and methods for controlling substrate temperature for high temperature PVD processes.

SUMMARY

The present disclosure generally relates to apparatus and methods for controlling substrate temperature in a processing chamber during high temperature processing.

One embodiment of the present disclosure provides a pedestal assembly. The pedestal assembly includes an electrostatic chuck having a substrate supporting surface, a base plate attached to the electrostatic chuck and having cooling channels formed therein, and a cooling assembly connected to the cooling channels via an inlet passage and an outlet passage. The cooling assembly includes a pump for generating a flow of a cooling gas, a flow controller coupled between the pump and the inlet passage, and a heat exchanger coupled to the outlet passage.

Another embodiment of the present disclosure provides an apparatus for processing a semiconductor substrate. The apparatus includes a chamber body defining a processing volume, and a pedestal assembly for supporting one or more substrates during processing. The pedestal assembly includes an electrostatic chuck having a substrate supporting surface and disposed in the processing volume, and a base plate attached to the electrostatic chuck, wherein the base plate has cooling channels formed therein. The apparatus further includes a cooling assembly connected to the cooling channels of the pedestal assembly via an inlet passage and an outlet passage. The cooling assembly is disposed outside the processing volume. The cooling assembly includes a pump for generating a flow of a cooling gas, a flow controller coupled between the pump and the inlet passage, and a heat exchanger coupled to the outlet passage.

Yet another embodiment of the present disclosure provides a method for controlling temperature of a substrate being processed. The method includes processing a substrate on a substrate support in a processing chamber, supplying a flow of cooling gas to cooling channels formed in the substrate support to control temperature of the substrate, flowing the flow of cooling gas exiting the cooling channels through a heat exchanger, and releasing the flow of cooling gas back to an environment surrounding the processing chamber. In one embodiment, the substrate support may be an electrostatic chuck.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure relate to apparatus and methods for stabilizing substrate temperature during high temperature processing. More particularly, embodiments of the present disclosure use an open loop air circulation in cooling channels of a high temperature substrate support. Embodiments of the present disclosure provides apparatus and method for stabilizing substrate temperature by flowing a flow of cooling gas to an inlet of cooling channels in a substrate support, receiving the flow of cooling gas from an outlet of the cooling channel using a heat exchanger, and releasing the cooled cooling gas to the environment. A pump may be coupled to the inlet of the cooling channels to extract air from the environment surrounding the processing chamber, for example from the cleanroom where the processing chamber is housed. The heat exchanger may be positioned adjacent to the processing chamber so that there is no need for an exhaust line extending to outside the building.

Embodiments of the present disclosure allow using air in the clean room as the cooling gas and enable release of the used cooling gas directly to the environment without raising temperature of the clean room environment and without releasing potentially dangerously hot exhaust cooling gas, for example exhaust cooling gas at a temperature of greater than 200° C., to the work/maintenance area immediately surrounding the processing chamber.

Embodiments of the present disclosure may be used to stabilize substrate temperature during a high temperature processing performed for an extended period of time. For example, embodiments of the present disclosure demonstrate the ability to control substrate temperature near about 400 degrees Celsius and for processing time to over 1000 seconds without triggering a thermally induced process drift and degradation of the film being deposited. Embodiment of the present disclosure may be used to cool a high temperature substrate support used in a physical vapor deposition (PVD) chamber, a plasma enhanced PVD chamber, an etch chamber, or other suitable chambers. Embodiments of the present disclosure using an inert gas or air as a cooling fluid for temperature control in high temperature substrate supports.

Figure 1:
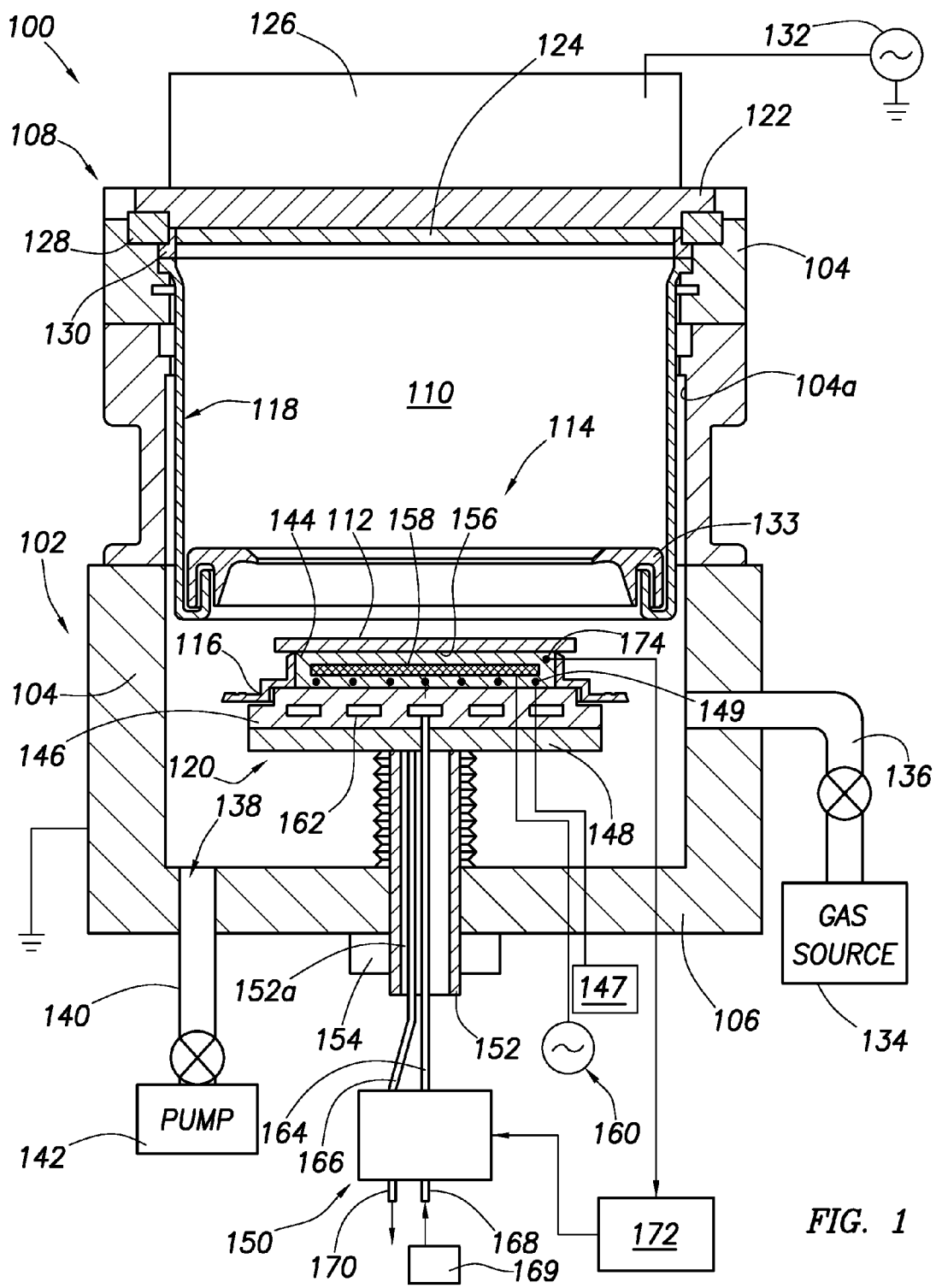
FIG. 1 is a schematic sectional view of a physical vapor deposition chamber according one embodiment of the present disclosure.

FIG. 1 is a schematic sectional view of a physical vapor deposition chamber 100 according one embodiment of the present disclosure. The processing chamber 100 includes a chamber body 102 having sidewalls 104, a chamber bottom 106, and a lid assembly 108 that enclose an interior volume 110. A pedestal assembly 120 is disposed in the interior volume 110 for supporting a substrate 112 during processing. A process kit 114 may be disposed in the interior volume 110. The process kit 114 may include at least a deposition ring 116 positioned to cover the pedestal assembly 120, and a ground shield 118 positioned to cover interior surfaces 104a of the sidewalls 104.

The lid assembly 108 generally includes a target backing plate 122, a target 124, and a magnetron 126. The target backing plate 122 may be supported by the chamber walls 104. A ceramic ring seal 128 may be disposed between the target backing plate 122 and the chamber walls 104. The ceramic ring seal 128 functions as both a vacuum seal and an electrical isolator between the chamber body 102 and the target backing plate 122. An upper shield ring 130 is disposed between the target 124 and the ground shield 118. The upper shield ring 130 is disposed intentionally close to but not touching the target 124 to limit plasma ignition surrounding sides of the target 124 and the backing plate 122 thus preventing any sputter of redeposited material from the sidewalls of the target 124 and the backing plate 122.

The target 124 may be biased with RF and/or DC power relative to ground, e.g. the chamber body 102, by a power source 132. A gas, such as argon, is supplied to the interior volume 110 from a gas source 134 via conduits 136. The gas source 134 may comprise a reactive gas or non-reactive gas. A plasma is formed from the gas between the substrate 112 and the target 124. Ions within the plasma are accelerated toward the target 124 and cause material to become dislodged from the target 124. The dislodged target material is deposited on the substrate 112. During processing, the lid assembly 108, the upper shield ring 130, the ground shield 118, the deposition ring 116, and a cover ring 133 confine the plasma formed in the interior volume 110 to the region above the substrate 112.

Spent process gas and byproducts are exhausted from the processing chamber 100 through exhaust ports 138 that receive spent process gas and direct the spent process gas to an exhaust conduit 140 connected to one or more exhaust pumps 142.

The pedestal assembly 120 may be movably disposed over to the chamber bottom 106. In one embodiment, the pedestal assembly 120 may include a substrate support 144, a base plate 146, a ground plate 148 and a gas cooling assembly 150. The substrate support 146, the base plate 146 and the ground plate 148 may be stacked together forming a disk body attached to a central shaft 152. A lift mechanism 154 may be coupled to the central shaft 152 of the pedestal assembly 120 to move the pedestal assembly 120 between an upper position for processing and a lower position for substrate loading/unloading.

The substrate support 144 has an upper surface 156 for supporting the substrate 112 thereon. In one embodiment, the substrate support 144 may be an electrostatic chuck that includes a dielectric body having electrodes 158 embedded therein. The dielectric body is typically fabricated from a high thermal conductivity dielectric material such as pyrolytic boron nitride, aluminum nitride, silicon nitride, alumina or an equivalent material. The electrodes 158 may be coupled to a power source 160, which provides power to the electrode 158 to control the chucking force.

The substrate support 144 may include one or more heating elements 149 to maintain the substrate support 146 and the substrate 112 at a desired temperature. In one embodiment, the heating elements 149 may be resistive heaters embedded in the substrate support 144 below the electrode 158. The heating elements 149 may be coupled to a power supply 147. To maintain a desired temperature during a short time deposition process, the heating elements 149 may be turned down or off during high power depositions when the temperature of the substrate support 144 and the substrate 112 raises above an initial temperature set point. When the deposition time becomes long, additional cooling may be needed to maintain a desired temperature.

The substrate support 144 may be attached to the base plate 146 by diffusion bonds or other bonding methods to provide good thermal conduction between the base plate 146 and the substrate support 144. The base plate 146 may function as a heat sink to maintain temperature stability in the substrate support 144 and the substrate 112 during processing. The base plate 146 may be formed from a material having thermal properties that are suitably matched to the overlying substrate support 144. For example, the base plate 146 can comprise a composite of ceramic and metal, such as aluminum or silicon carbide. Alternative, the base plate 146 can be made completely from a metal, such as stainless steel, copper, or aluminum.

The ground plate 148 may provide support to the substrate support 144 and the base plate 146. The ground plate 148 is typically fabricated from a metallic material such as stainless steel or aluminum. The base plate 146 may be removable from the ground plate 148 for facilitating easier replacement and maintenance of the substrate support 144 and base plate 146.

In one embodiment, the base plate 146 may include cooling channels 162. The temperature of the base plate 146 may be actively controlled, cooled or heated, by a temperature regulating fluid flowing through the cooling channels 162. In one embodiment, the cooling channels 162 may be connected to the gas cooling assembly 150 through passages 164, 166. The passages 164, 166 may be disposed through an inner volume 152a of the central shaft 152 to connect the cooling channels 162 in the base plate 146 and the gas cooling assembly 150 disposed outside the chamber body 102.

In one embodiment, the cooling assembly 150 is configured to use air from the environment of the processing chamber 100 as cooling fluid. The cooling assembly 150 may include an inlet 168 that extracts air from the environment immediately outside the process chamber 100 for cooling and an outlet 170 that outputs air circulated through the cooling channels 162 back to the environment. The inlet 168 and the outlet 170 both open to the environment immediately outside the processing chamber 100, such as the cleanroom where the process chamber is disposed or a minienvironment. The cooling assembly 150 may include a pump to drive the air through the cooling channels 162. The cooling assembly 150 may include a heat exchanger to restore temperature of the air back to the ambient temperature before releasing the air to the environment. The heat exchanger in the cooling assembly 150 enables the susceptor assembly 160 to be cooled using air from the immediate environment without requesting additional pipes to send hot air from the cooling channels to outside environment.

Alternatively, a compressed gas source 169, such as compressed clean dry air (CDA) or Nitrogen, may be coupled to the inlet 169 as a gas source for the cooling channels 162. In one embodiment, the compressed gas source 169 may be bottled CDA or nitrogen. In another embodiment, the compressed gas source 169 may be the existing supply of CDA or nitrogen by a house system supplied from a cryogenic liquid nitrogen tank.

Processes performed in the process chamber 100 are controlled by a controller 172 that executes a program code having instruction sets to operate components of the chamber 100 to facilitate processing of substrates in the processing chamber 100. In one embodiment, the controller 172 may actively control the temperature of the substrate support 146. For example, the controller 172 may be connected to one or more temperature sensors 174 positioned to measure temperature of the substrate 112 and/or the substrate support 148. The temperature sensor 174 is shown embedded in the substrate support 146. Alternatively, the one or more temperature sensor 174 may be position in other locations, or be non-contact sensors. The controller 172 may send control signals to the cooling assembly 150 according to the temperature measured by sensor 174 to adjust the cooling process. For example, the control signals may include signals that control the pressure and/or the flow rate of the cooling fluid through the cooling channels 162.

Figure 2:
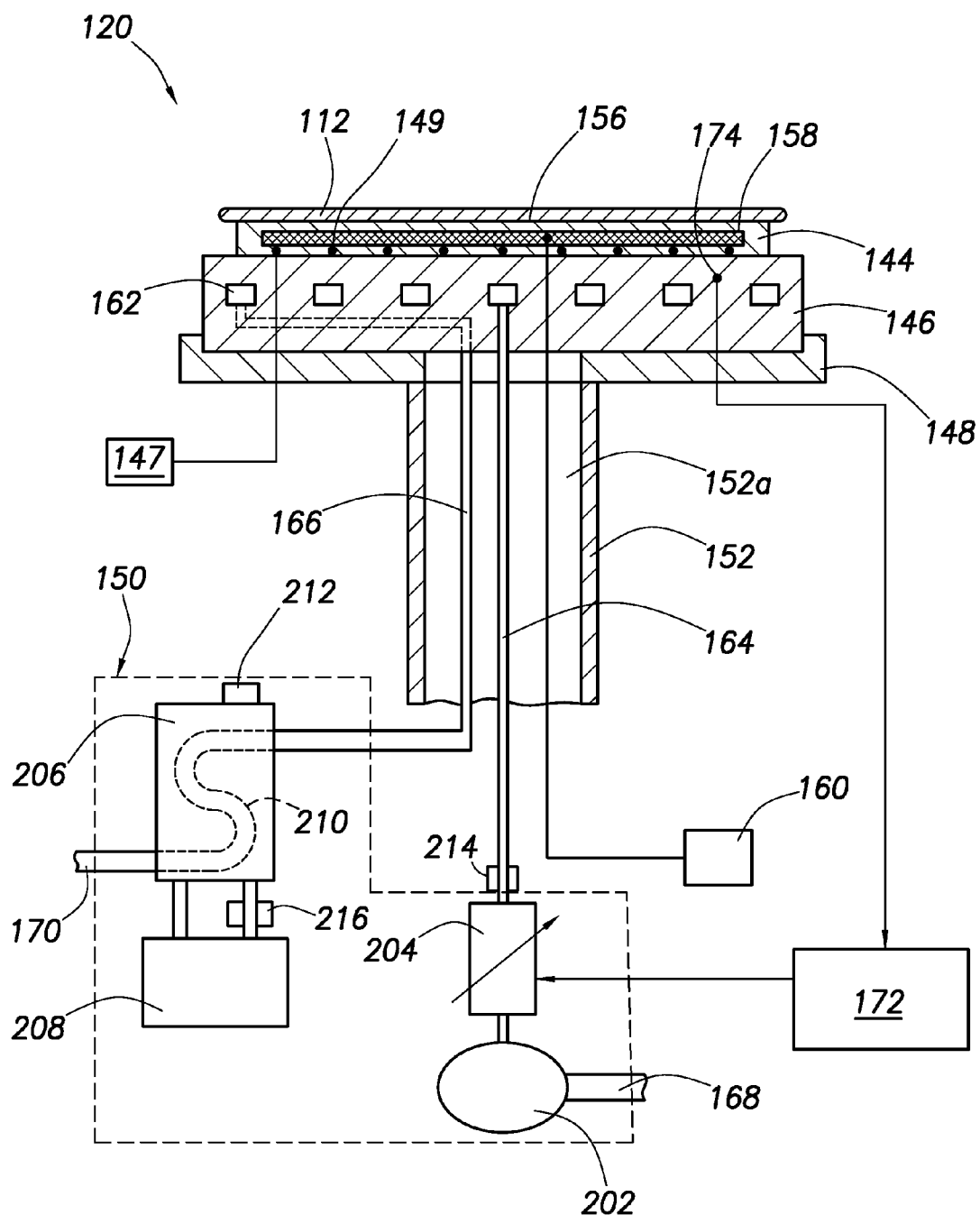
FIG. 2 is a schematic substrate support for temperature control during high temperature processing.

FIG. 2 is a schematic sectional view of the pedestal assembly 120 showing details of the cooling assembly 150 according to one embodiment of the present disclosure. The cooling assembly 150 may be connected to the cooling channels 162 in the base plate 146 through passages 164, 166. The cooling channels 162 may be formed in the base plate 146 in a configuration that promotes uniform temperature within the base plate 146. The passages 164, 166 may be tubing suitable for conveying hot fluid, for example flow of air at temperature up to about 200 degrees Celsius. The passages 164, 166 may be silicone tubing or metal tubing.

The cooling assembly 150 may include a pump 202. The pump 202 may be used to extract air from immediate environment, for example, environment in the cleanroom, through the inlet 168 and pump the extracted air to the cooling channels 162 via the passage 164. Alternatively, the pump 202 may be connected to an inert gas source for delivering an inert gas to the cooling channels 162. A flow controller 204 may be coupled to the pump 202 to adjust the pressure and/or the flow rate output from the pump 202. In one embodiment, the flow controller 204 may be connected to and controlled by the system controller 172. In one embodiment, the system controller 172 may control flow rate and/or pressure of the air flow using the flow controller 204 in response to the temperature of the substrate 112 or substrate support 146 measured by the temperature sensor 174 disposed in the pedestal assembly 120. For example, the flow rate and/or pressure of the air flow may be increased if the temperature of the pedestal assembly 120 or the substrate 112 is higher than a target temperature and the flow rate and/or pressure of the air flow may be reduced if the temperature of the pedestal assembly 120 or the substrate 112 is lower than a target temperature.

While flowing through the cooling channels 162, heat exchange occurs between the base plate 146 and the air flow. During processes when the pedestal assembly 120 is maintained at an elevated temperature, temperature of the air flow increases from the heat exchange. As a result, the air flow exiting through the passage 166 may be at a temperature of up to about 200 degrees Celsius.

In one embodiment, the cooling assembly 150 includes a heat exchanger 206 coupled to the passage 166 to reduce temperature of the air before releasing the air flow back to the environment, such as the environment in the cleanroom. The heat exchanger 206 may include gas passages 210 connected between the outlet passage 166 and the outlet 170. The heat exchanger 206 may be coupled to a cooling fluid source 208. The high temperature air flow exciting from the cooling channels 162 enters the heat exchanger 206 to be cooled down before entering back to the environment, as the environment in the cleanroom, through the outlet 170. In one embodiment, the heat exchanger 206 may lower the temperature of the air flow to about room temperature so that the exhaust air from the cooling channels 162. By cooling the exhaust air from the cooling channels, embodiments of the present disclosure provides a safe environment for operating and maintenance personnel. Cooling the exhaust air also prevents any potential for damage to surrounding components. Cooling the exhaust air also prevent undesired change of ambient temperature surrounding the processing chamber.

The heat exchanger 206 allows the cooling assembly 150 to air cooling of the pedestal assembly 120 without requiring flow paths to direct the exhaust hot air out of the building where the processing chamber is positioned.

In one embodiment, a snap switch thermal cutoff 212 may be positioned to be in contact with the heat exchanger 206 as a safety device to prevent the heat exchanger 206 from overheating. For example, when the cooling water flow to the heat exchanger 206 is interrupted, the heat exchanger 206 may eventually overheat, potentially reach a temperature in excess of 200° C. The overheating could damage the heat exchanger 206 and surrounding components in the cooling assembly 150, and would lead to hot exhaust gas being released to the immediate environment and be unsafe. The snap switch thermal cutoff 212 may shut down or trigger a shut down when temperature of the heat exchanger 206 exceeds a predetermined value.

The cooling assembly 150 may also include a flow monitor 214 to monitor the flow of the cooling gas and ensure that the flow of cooling gas is not interrupted. Interrupting the flow of cooling gas would lead to process drift as the substrates would be overheated without proper cooling. The flow monitor 214 may provide an indicator, such as an alarm, when the flow of cooling gas is interrupted.

The cooling assembly 150 may further include a flow monitor 216 to the cooling water loop for the heat exchanger 206 to make sure that there is sufficient flow of cooling water through the heat exchanger 206.

Figure 3:
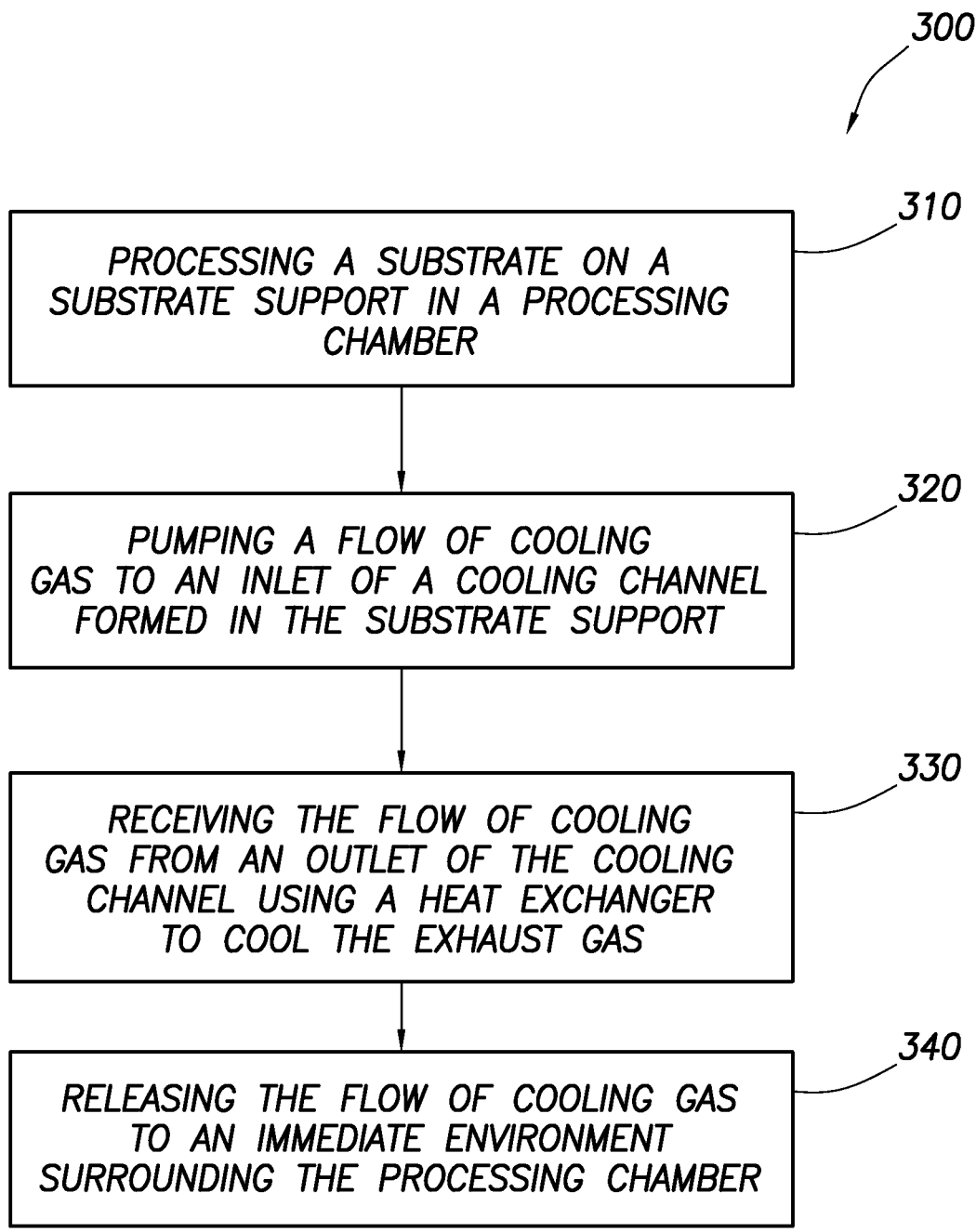
FIG. 3 is a flow chart of a method for temperature control according to one embodiment of the present disclosure.

FIG. 3 is a flow chart of a method 300 for controlling a temperature of a substrate during processing according to one embodiment of the present disclosure. In box 310, a substrate to be processed is positioned on a substrate support in a processing chamber. The processing chamber may be the processing chamber 100 of FIG. 1 or other suitable chambers. The substrate support may be the pedestal assembly 120 or the substrate 112 described above. During processing, the substrate may drift away from the target temperature, for example being over heated by the processing environment, such as the processing plasma. The temperature of the substrate may be maintained at a temperature greater than about 200 degrees Celsius. In one embodiment, the temperature of the substrate may be maintained between about 400 degrees Celsius and about 450 degrees Celsius. In one embodiment, the processing may be a physical vapor deposition process that lasts up to 1000 seconds.

In box 320, a flow of cooling gas may be pumped to the substrate support to cool the substrate and to maintain the substrate at the target temperature. The flow of cooling gas may be a flow of air extracted from the environment (i.e. cleanroom or minienvironment) where the processing chamber is positioned. Alternatively, the flow of cooling gas may be an inert gas from an inert gas source. By using cooling gas or cooling air, embodiments of the present disclosure enable cooling and temperature control at the temperature range higher than boiling point of water or decomposition temperature of most conventional cooling fluid. For example, embodiment of the present disclosure enable cooling and temperature control of an object at a temperature higher than about 200 degrees Celsius, for example between about 400 degrees Celsius and about 450 degrees Celsius. In one embodiment, the flow rate and/or pressure of the cooling gas may be adjusted to adjust the temperature of the substrate support and the substrate. For example, the flow rate and/or pressure of the cooling gas may be increased to reduce the temperature of the substrate support and the substrate, and the flow rate and/or pressure of the cooling gas may be reduced to lower the temperature of the substrate support and the substrate. In one embodiment, the flow rate and/or pressure of the cooling gas may be adjusted by tuning a flow controller coupled to a pump for generating the flow of cooling gas. In one embodiment, the flow controller may be adjusted in response to measurement of a temperature sensor measuring the substrate.

In box 330, the exhaust cooling gas, being heated in the cooling channels, is received by a heat exchanger. The heat exchanger, such as the heat exchanger 206 in FIG. 2, may be positioned adjacent to the processing chamber, so that the exhaust cooling gas is not exposed to the environment, such as the cleanroom or minienvironment, before entering the heat exchanger. The heat exchanger may be cooled by a cooling fluid, such as water. The exhaust cooling gas is cooled in the heat exchanger. In one embodiment, the exhaust cooling gas may be cooled to about room temperature in the heat exchanger.

In box 340, after cooling in the heat exchanger, the exhaust cooling gas is released to the environment, such as the cleanroom or minienvironment where the processing chamber is positioned, after cooling. Since the exhaust cooling gas is cooled by the heat exchanger, the exhaust cooling gas may be released directly to the cleanroom without substantially affecting the temperature of the cleanroom or minienvironment.

Even though a PVD chamber is discussed above, embodiments of the present disclosure may be used in any pedestal type substrate support where thermal load can be offset by a sufficient amount of gas flowing through the pedestal. Alternatively, embodiments of the present disclosure may be used outside semiconductor processing, such as solar cell manufacturing, where a substrate on a substrate support is exposed to heat during processing and temperature control is desired.

While the foregoing is directed to embodiments of the present disclosure, other and further embodiments of the disclosure may be devised without departing from the basic scope thereof, and the scope thereof is determined by the claims that follow.

The invention claimed is:

1. A pedestal assembly, comprising:
    an electrostatic chuck having a substrate supporting surface;
    a base plate attached to the electrostatic chuck and having cooling channels formed therein, wherein the cooling channels have an inlet passage and an outlet passage; and
    a cooling assembly connected to the cooling channels via the inlet passage and the outlet passage, wherein the cooling assembly comprises:
        an inlet coupled to a gas source;
        an outlet open to an immediate environment outside a processing chamber wherein the base plate is disposed;
        a flow controller coupled between the inlet and the inlet passage; and
        a heat exchanger coupled to the outlet, wherein the heat exchanger is not coupled between the inlet and the inlet passage.

2. The pedestal assembly of claim 1, wherein the gas source comprises a pump to extract air from the immediate environment.

3. The pedestal assembly of claim 2, wherein the heat exchanger comprises gas passages connected between the outlet passage and the outlet.

4. The pedestal assembly of claim 3, wherein the cooling assembly further comprises a cooling liquid source coupled to the heat exchanger, and the heat exchanger performs liquid and gas heat exchanges.

5. The pedestal assembly of claim 1, further comprising a controller coupled to the flow controller.

6. The pedestal assembly of claim 5, wherein the controller sends control signal to the flow controller to adjust a flow rate and a pressure of the flow of cooling gas.

7. An apparatus for processing a semiconductor substrate, comprising:
    a chamber body defining a processing volume;
    a pedestal assembly for supporting one or more substrate during processing, wherein the pedestal assembly comprises:
        an electrostatic chuck having a substrate supporting surface and disposed in the processing volume; and
        a base plate attached to the electrostatic chuck, wherein the base plate has cooling channels formed therein, wherein the cooling channels have an inlet passage and an outlet passage; and
    a cooling assembly connected to the cooling channels of the pedestal assembly via the inlet passage and the outlet passage, wherein the cooling assembly is disposed outside the processing volume, and the cooling assembly comprises:
        an inlet coupled to a gas source;

an outlet open to an immediate environment outside the chamber body;

a flow controller coupled between the inlet and the inlet passage; and a heat exchanger coupled to the outlet, wherein the heat exchanger is not coupled between the inlet and the inlet passage.

8. The apparatus of claim 7, wherein the cooling assembly is disposed adjacent to the chamber body.

9. The apparatus of claim 8, wherein the gas source comprises one of a pump to extract air from the immediate environment outside the chamber body, a compressed gas source and an existing system gas source.

10. The apparatus of claim 9, wherein the heat exchanger comprises gas passages connected between the outlet passage and the outlet.

11. The apparatus of claim 10, wherein the cooling assembly further comprises a cooling liquid source coupled to the heat exchanger, and the heat exchanger performs liquid and gas heat exchanges.

12. The apparatus of claim 7, further comprising a controller coupled to the cooling assembly.

13. The apparatus of claim 12, wherein the controller sends control signal to the cooling assembly to adjust a flow rate and/or a pressure of the flow of cooling gas.

14. The apparatus of claim 13, further comprising one or more temperature sensors coupled to the controller, and the controller adjusts the flow rate and/or the pressure of the flow of cooling gas according to measurements of the one or more temperature sensors.

15. A method for controlling temperature of a substrate being processed, comprising:

processing a substrate on a substrate support in a processing chamber;

supplying a flow of cooling gas to an inlet passage of cooling channels formed in the substrate support to control temperature of the substrate;

flowing the flow of cooling gas exiting the cooling channels through a heat exchanger, wherein the heat exchanger is not connected with the inlet passage; and releasing the flow of cooling gas from the heat exchanger to an environment surrounding the processing chamber.

16. The method of claim 15, wherein supplying a flow of cooling gas comprising extracting a flow of air from the environment surrounding the processing chamber.

17. The method of claim 16, wherein processing the substrate comprises maintaining the temperature of the substrate between about 400 degrees Celsius to about 450 degrees Celsius.

18. The method of claim 16, wherein processing the substrate comprises forming physical vapor deposition over the substrate for a time period of longer than about 1000 seconds.

19. The method of claim 15, wherein supplying the flow of cooling gas comprises adjusting a flow rate and/or pressure of the flow of cooling gas to adjust the temperature of the substrate.

20. The method of claim 19, further comprising measuring a temperature of the substrate via one or more temperature sensors, and adjusting the flow rate and/or pressure of the flow of cooling gas.

* * * * *